United States Patent [19]

Nagesh et al.

[11] Patent Number: 5,275,897
[45] Date of Patent: Jan. 4, 1994

[54] PRECISELY ALIGNED LEAD FRAME USING REGISTRATION TRACES AND PADS

[75] Inventors: V. K. Nagesh, Cupertino; Robert Crawford, Palo Alto; Raj Pendse, Fremont, all of Calif.

[73] Assignee: Hewlett Packard Company, Palo Alto, Calif.

[21] Appl. No.: 887,220

[22] Filed: May 21, 1992

Related U.S. Application Data

[63] Continuation of Ser. No. 575,099, Aug. 30, 1990, Pat. No. 5,138,429.

[51] Int. Cl.$^5$ .............. G03F 9/00; G03C 5/00
[52] U.S. Cl. .................... 430/22; 430/311; 430/313; 430/318; 430/319; 430/394; 156/659.1; 428/209; 428/220; 257/666; 257/678; 257/701
[58] Field of Search ............. 428/209, 220, 543, 901; 430/311, 313, 318, 319, 394, 22; 156/659.1; 357/74, 70, 80

[56] References Cited

U.S. PATENT DOCUMENTS 4,707,363 10/1987 Barber et al. .............. 428/137
4,786,545 11/1988 Sakuma et al. ............. 428/209

Primary Examiner—John Kight, III
Assistant Examiner—T. Mosley

[57] ABSTRACT

Assemblies of aligned tape automated bonding frames on a substrate, and a method of aligning a tape automated bonding frame to connection sites on the substrate. The method includes photolithographically patterning and etching metal to form a first pattern of signal leads and a second pattern of alignment leads. A semiconductor chip is bonded to the inner lead ends of the first pattern. Metal on a substrate is photolithographically patterned and etched to provide a third pattern of substrate connection sites and a fourth pattern of registration pads. The fourth pattern of registration pads has geometric and dimensional features which precisely correspond to those of the alignment leads. Moreover, the spatial relationship of the third and fourth patterns correspond to the spatial relationship of the first and second patterns. The corresponding geometric and dimensional features of the second and fourth patterns are aligned, whereafter the registration pads and the alignment leads are soldered together. The attachment of the second and fourth patterns provide fixed registration of the first and third patterns. Preferably, the substrate includes redundant registration pads to facilitate replacement of a defective semiconductor chip.

13 Claims, 2 Drawing Sheets

PRECISELY ALIGNED LEAD FRAME USING REGISTRATION TRACES AND PADS

CROSS REFERENCED TO RELATED APPLICATION

This is a continuation of application Ser. No. 07/575,099, filed on Aug. 30, 1990, now U.S. Pat. No. 5,138,419.

DESCRIPTION

1. Technical Field

The present invention relates generally to tape automated bonding and particularly to an aligned assembly and the system and method of alignment.

2. Background Art

In the electronics industry, ever-present goals are to minimize integrated circuit chip packaging and to minimize the lengths of interconnections between chips. Multi-chip modules are designed to address these goals. Multi-chip modules package and interconnect a plurality of chips in a functional relationship. The advantages of multi-chip modules are primarily in terms of packaging density and operational speed. The main disadvantage involves the cost of manufacturing such modules.

Among the reasons for the high cost of multi-chip modules is the relatively low manufacturing yield of the modules. As the number of integrated circuit chips within a package increases, the likelihood of a defect within the package also increases. Typically, testing of the individual chips prior to interconnection with a multi-chip module is not possible. Later detection of a defective chip within a module may result in the entire module having to be discarded.

An interconnection technique which permits pre-testing of chips is referred to as "tape automated bonding." This fabrication procedure utilizes a continuous insulated tape which is similar to photographic film to provide a planar substrate for chips that are attached to individual sections, or frames, of the tape. A spider-like metal pattern of conductive traces is etched on each frame. The traces may either "fanout," i.e. radiate from the center of the frame to the four edges, or may be four sets of parallel lines, with each set extending perpendicularly from one edge of a chip. The chip is carefully aligned over the center of the frame so that the contacts of the chip are precisely located at corresponding conductive traces in the central portion of the frame. The chip is then attached to the tape automated bonding frame. This connection of the chip contacts to the inner portion of the frame is referred to as "inner lead bonding."

After the inner lead bonding has been performed, the integrated circuit chip may be tested. The chip can be thoroughly exercised electrically. After testing of a chip, the outer leads of the frame are microbonded to pads on a substrate. The attachment of the conductive traces of the frame to the pads of the substrate is referred to as "outer lead bonding." The substrate is that portion of the multi-chip module which permits mounting of more than one lead frame for electrical communication between the chips supported by the frames.

Proper alignment of the lead frame with the substrate during outer lead bonding is critical. The conductive traces of the lead frame are closely spaced. A center-to-center distance, or "pitch," between conductive traces may be 4 mils. Fineline tape automated bonding frames increase the chances of electrical short circuits and of electrical failure resulting from misalignment.

U.S. Pat. No. 4,696,526 to Newton et al. teaches use of alignment posts which engage holes in the tape automated bonding frame to insure proper registration of a tape automated bonded integrated circuit chip to a base unit. A method of providing precision mounted posts and precision drilled holes has worked well in most applications of aligning tape automated bonding frames. However, with fine line frames reaching pitches as small as 4 mils, it becomes more difficult to achieve the necessary accuracy by means of such a method. An accuracy of 0.3 mil is necessary to achieve an 80% overlap of outer leads of the lead frame to the connection sites of the substrate. Moreover, the method of precision mounting studs engaging precision drilled holes is an expensive one. Common materials used in the art of tape automated bonding are alumina and aluminum nitride. The placement of alignment posts through these materials is not easily accomplished and can result in a low manufacturing yield. Another problem is that the placement of posts and holes create stress points to weaken the overall structure.

Another method of aligning outer leads to a substrate is described in U.S. Pat. No. 4,899,207 to Hallowell et al. A support ring is employed to secure the outer leads in proper position for alignment with the connection sites of the substrate. The support ring prevents x-y sliding of the outer leads during bonding and prevents curling of the leads. However, the support ring is used only after the outer leads have been properly aligned with the connection sites of the substrate. That is, the support ring is used to maintain the alignment only after the exacting alignment has been achieved.

An object of the present invention is to provide a system and method for precisely aligning the outer leads of a tape automated bonding frame to connection sites on a substrate. Another object is to provide such a system and method which are reliable and cost effective.

SUMMARY OF THE INVENTION

The above objects have been met by manufacture of alignment features on both a tape automated bonding frame and on a substrate without adding steps to the manufacture of the frame or the substrate. The alignment features can be photolithographically patterned and etched at the same time and in the same manner as the leads of the frame and connection sites of the substrate. The frame includes a pattern of alignment traces which precisely correspond to the position and to dimensions of registration pads on the substrate.

In the manner standard to the art, a conductive material, e.g., copper, is photolithographically patterned and etched to form signal leads which extend radially outwardly from inner leads to outer leads. The inner leads are bonded to an integrated circuit chip, whereafter the chip can be tested. During the same etching process, alignment traces are formed from the conductive material. The alignment traces are precisely dimensioned and precisely spaced from each other, as well as from the pattern of signal leads.

The substrate is also photolithographically patterned and etched to include signal leads. The signal leads of the tape automated bonding frame correspond to the signal leads of the substrate. Also etched to the substrate are registration pads. The registration pads precisely correspond both spatially and dimensionally to the alignment traces of the tape automated bonding frame.

Rather than requiring a focus on aligning the pattern of signal leads of the frame to the signal leads of the substrate, here the focus is on aligning the registration pads and the alignment traces. Because the alignment traces are significantly larger in size than the signal leads, proper positioning is more easily achieved. The alignment traces can then be soldered to the registration pads, thereby fixing the two patterns of signal leads for electrical communication therebetween.

The aligned patterns of signal leads of the frame and the substrate can be soldered together. Alternatively, a compression force may be applied to the outer leads of the tape automated bonding frame to insure proper contact of the two patterns of signal leads.

An advantage of the present invention is that the formation of the alignment traces and the registration pads is an inexpensive process with a high degree of accuracy. An accuracy of 5 microns or better is typical. Another advantage is that alignment is a focus on a limited number of pads, rather than patterns which include hundreds of signal leads. Moreover, as noted above, the pads are significantly larger than the signal leads.

Another advantage is that redundant registration pads may be formed on the substrate to facilitate replacement of a defective tape automated bonding frame. For example, where signal leads are connected by compression force, replacement merely requires removal of the compression force, peeling of the alignment traces of the defective frame, soldering the alignment traces of the replacement frame to the redundant registration pads, and reapplication of the compression force.

BEST MODE FOR CARRYING OUT THE INVENTION

Figure 1:
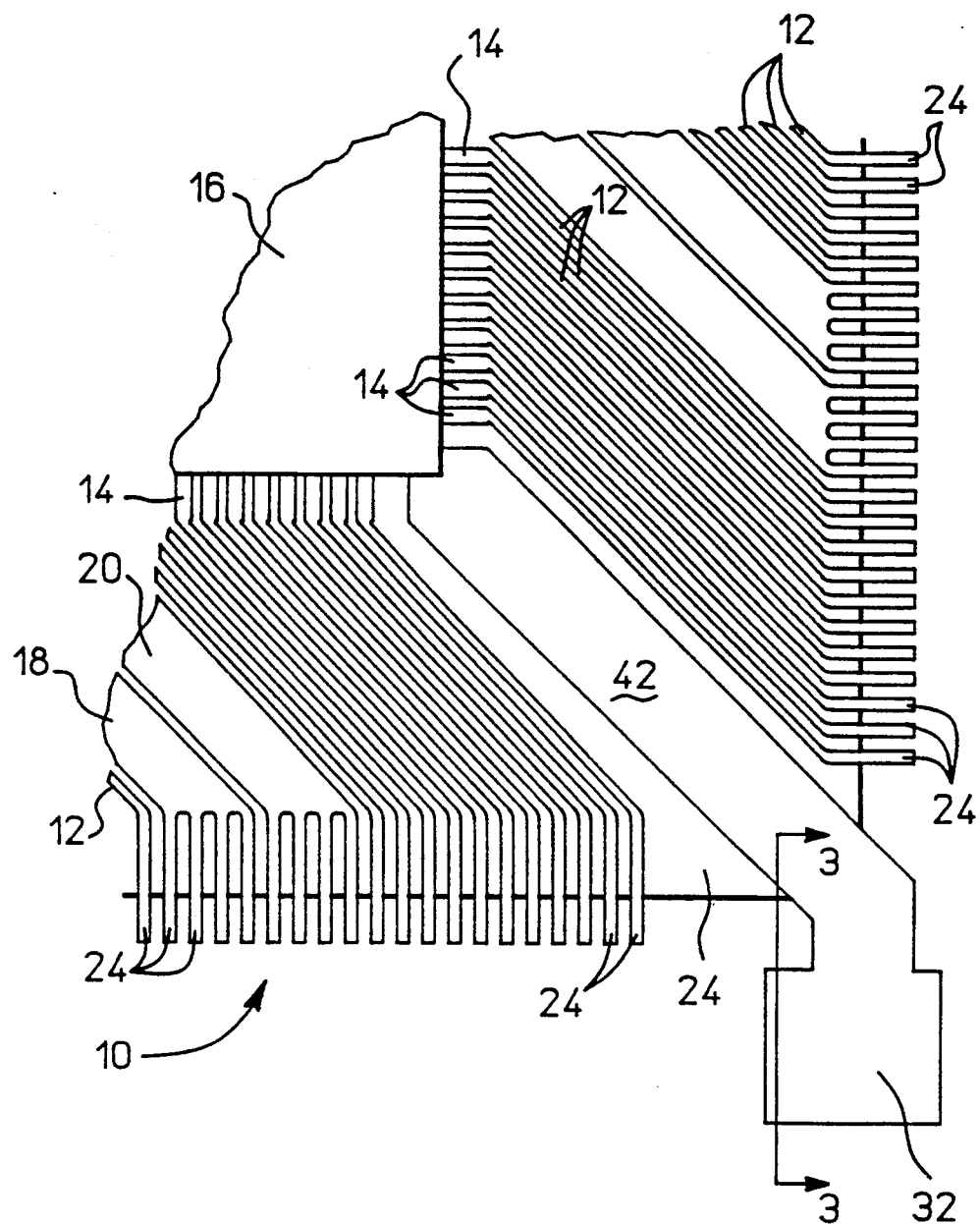
FIG. 1 is a top view of a corner portion of a tape automated bonding frame in accord with the present invention.

With reference to FIG. 1, a tape automated bonding frame 10 is shown as having a plurality of conductive signal traces 12. The signal traces have inner leads 14 which connect to a semiconductor chip 16. An exemplary configuration would be a semiconductor chip 16 having 408 connection sites, with each of the inner leads 14 attached to one of the sites. The inner leads are simultaneously bonded by thermocompression or gold-tin eutectic methods to bumps on the chip. The bumps are gold bumps deposited on aluminum pads to ensure a good surface for thermocompression bonding. This "inner lead bonding" method, however, is not critical to the present invention.

Likewise, the "fanout" configuration of conductive signal traces 12 radiating from the chip 16 is not critical. The traces may alternatively be parallel traces extending perpendicularly from the chip. The traces are spaced together so closely that the center-to-center distance, or pitch, of two traces may be 4 mils.

The signal traces 12 are formed from a copper foil. The copper foil is photolithographically patterned and etched to provide the electrically isolated traces. For utility planes, the etching process may leave a larger area of copper, as shown at 18 and 20. For example, plane 18 may be at ground potential and plane 20 may be at a potential of 5 volts d.c. To aid in the bonding process, the copper traces 12 are preferably nickel plated and covered with a coating of gold.

An insulative tape 22 is used to support the fragile signal traces 12. The insulative tape is a polymer having a hole at its center for mounting of the semiconductor chip 16. The center hole allows space for the inner lead bonding.

The resulting assembly of the chip 16 and the tape automated bonding frame 10 is essentially a space transformer to afford testing of the chip and, after testing, interconnection with a second chip. The semiconductor chip 16 can be thoroughly exercised electrically or can be burned-in before assembly. This testing is not possible in many other fabrication procedures. Typically, prior to testing, the traces 12 extend beyond what is shown in FIG. 1. If the results of testing are positive, the traces are cut to a shorter length for connection to outside circuitry. This allows testing apparatus to contact the fingers without affecting the integrity of a later bond. The signal traces 12 have portions which extend beyond the insulative tape 22. These portions are referred to in the art as "outer leads" 24.

Figure 2:
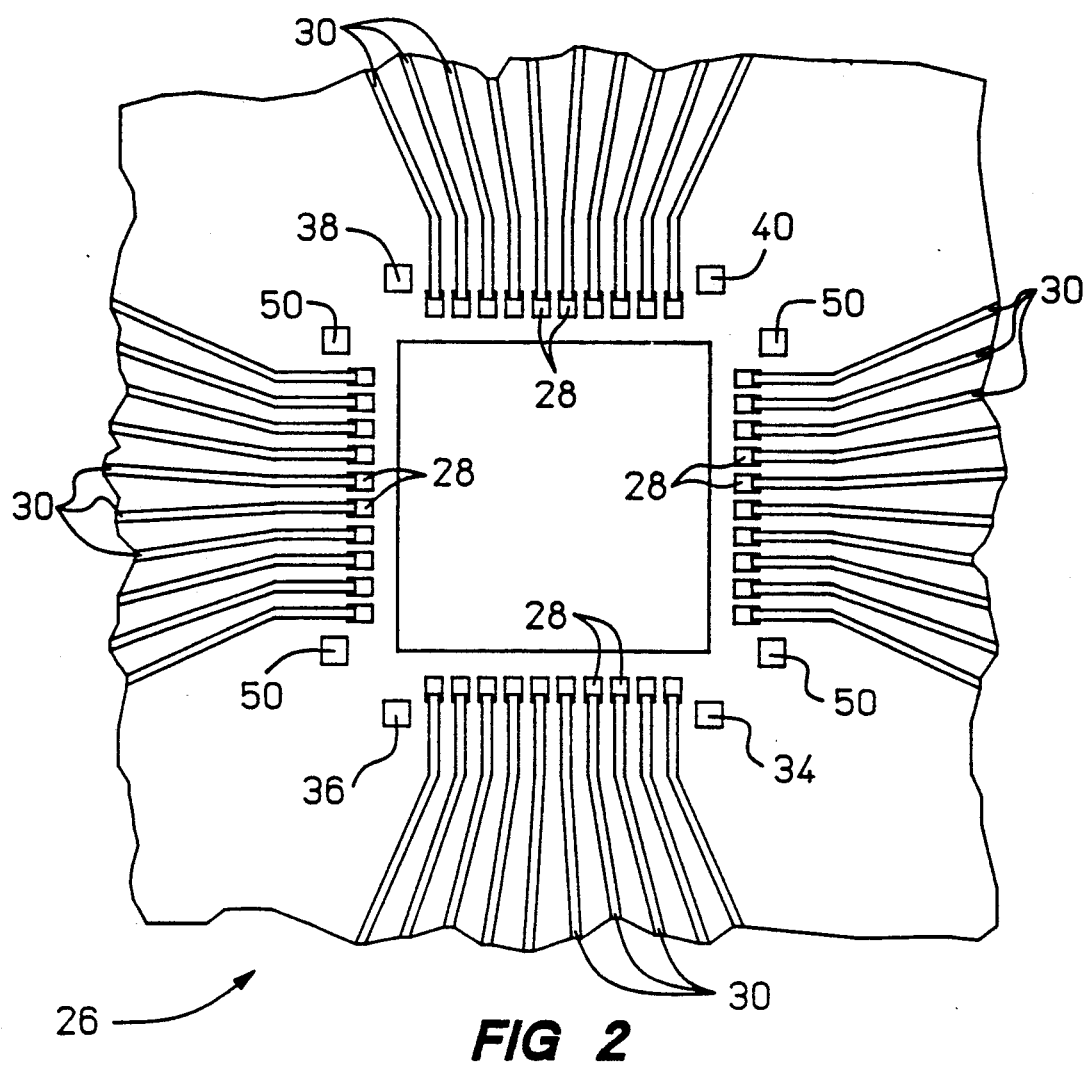
FIG. 2 is a top view of a substrate for engagement of the tape automated bonding frame of FIG. 1.

Referring now to FIGS. 1 and 2, a properly functioning semiconductor chip 16 is interconnected with other circuitry by attachment of the outer leads 24 of the signal traces 12. The tape automated bonding frame 10 is mounted to a substrate 26 in a manner such that the outer leads are aligned with connection sites 28 on the substrate 26. Substrate signal traces 30 link the connection sites 28 to other semiconductor chips, not shown, or their circuitry.

The alignment of the outer leads 24 of the tape automated bonding frame 10 with the connection sites 28 of the substrate 26 is critical. As noted above, the pitch of the outer leads 24 may be as small as 4 mils in a single frame 10 and may include 408 outer leads. A slight misalignment may cause a malfunction of the circuit. The present invention achieves alignment by inclusion of four corner pads 32 as part of the tape automated bonding frame 10. Only one corner pad is shown in FIG. 1, but the other three corner pads are identical in structure. The corner pads are photolithographically patterned and etched in the same manner and at the same time as the signal traces 12 and the utility planes 18 and 20. Thus, a high degree of accuracy in positioning the corner pads is possible. An accuracy of 5 microns or better is typical. Moreover, inclusion of the corner pads adds little to the expense of manufacturing the tape automated bonding frame 10.

The substrate 26 of FIG. 2 includes four registration pads 34, 36, 38 and 40 which dimensionally and spatially correspond to the four aligning traces 32 of the tape automated bonding frame 10. The registration pads 34-40 are photolithographically patterned and etched at the same time as the connection sites 28 and the substrate signal traces 30. Again, the etching process provides a high degree of accuracy. Thus, alignment of the outer leads 24 of the frame 10 to the connection sites 28 is possible without focusing upon the hundreds of outer leads of the frame. Rather, focus can be upon the precisely positioned and dimensioned aligning traces 32 and registration pads 34-40. Because the aligning traces and registration pads are significantly larger than the outer leads in the connection sites, alignment time is reduced. Standard split field optics are sufficient in achieving alignment of the registration pads to the aligning traces. The aligning traces are then bonded to the registration pads by any of the methods known in the art, such as solder, epoxy, adhesive, thermocompression or thermosonic bonding. This ensures that the tape automated bonding frame can be fixed in place for coupling of the outer leads 24 to the substrate connection sites 28.

The attachment end of the aligning trace 32 of FIG. 1 is shown as being generally square. This is not critical to the present invention. The attachment end may be of any other geometric shape. Moreover, each aligning trace on a tape automated bonding frame 10 may be of a different shape.

While the attachment end of the aligning trace 32 shown in FIG. 1 is identical in shape and dimensions to the four registration pads 34-40 shown in FIG. 2, this correspondence is only preferred and not critical. What is critical is that the aligning trace 32 and the registration pad to which the aligning trace is to be soldered must have corresponding geometric and dimensional features. For example, an aligning trace and a registration pad may have different shapes, but may have corresponding corners which are precisely dimensioned and precisely located to ensure proper alignment of the tape automated bonding frame to the substrate 26.

Figure 3:
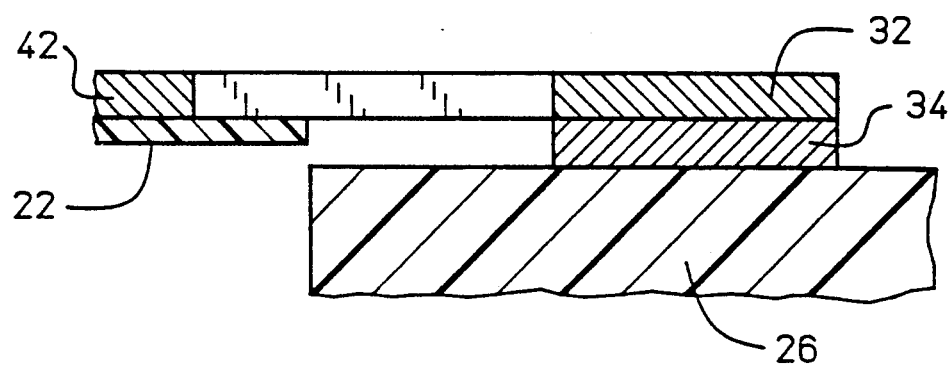
FIG. 3 is a side sectional view of the alignment system for the frame of FIG. 1 and the substrate of FIG. 2, taken along lines 3—3 of FIG. 1.

Referring now to FIG. 3, in operation, standard split field optics are used to align the attachment end of the aligning trace 32 to the registration pad 34. The aligning trace is then soldered to the registration pad. In this condition, the tape automated bonding frame is precisely located with respect to the substrate 26.

As noted above, the signal traces 12 and the aligning traces 32 of the tape automated bonding frame of FIG. 1 are formed by etching of copper. The aligning traces typically are plated with nickel and covered with gold, specifically for oxidation protection. The metallurgy of the registration pads 34-40 of FIG. 2 is identical to that of the aligning traces.

After the aligning traces 32 have been soldered to the registration 34-40, the corresponding patterns of outer leads 24 and substrate connection sites 28 are in an accurate one-to-one relationship. This one-to-one relationship is not shown in a comparison of FIG. 1 with FIG. 2. Rather, FIG. 2 is illustrated as having far less connection sites 28 than necessary to link with the tape automated bonding frame 10 of FIG. 1. The inconsistency is for the purpose of illustrating each of the four registration pads 34-40 in a single figure.

Aligned patterns of outer leads 24 and substrate connection sites 28 may be connected by techniques well known in the art. For example, thermal compression and thermal sonic techniques are used in thermal lead bonding.

Alternatively, contact at the outer leads 24 to the substrate connection sites 28 can be a demountable connection using compression force. Elastomers are brought into position over the outer leads with the aid of plastic guides, whereafter rings or frames are bolted to the substrate to press the elastomers for contact at the outer leads with substrate connection sites. The compression force is sufficient to ensure proper contact for electrical communication therethrough. This demountable technique of outer lead bonding facilitates repair or replacement of a defective semiconductor chip 16. Use of the demountable technique requires only four soldered connections, since only the aligning traces 32 and the registration pads 34-40 are soldered together.

Another feature which aids in replacement of a defective semiconductor chip is illustrated in FIG. 2. The substrate 26 includes four redundant registration pads 50. The redundant registration pads eliminate the need of desoldering aligning traces from registration pads during rework. Referring to FIG. 1, the longitudinal portion 42 of the aligning trace 32 may have a second attachment end, not shown, which would project at a ninety degree angle from the projection of the illustrated attachment end of the aligning trace 32. The second attachment end would be in precise position to align with a redundant registration pad 50. Thus, after removal of a first tape automated bonding frame, the redundant registration pads 50 could be used to align a replacement frame. The redundant features of the frame and of the substrate 26 are easily included using the same photolithographic etching process as that used to provide the initial aligning traces and registration pads.

We claim:

1. A method for aligning a pattern of conductive fingers on a tape automated bonding frame with a pattern of connection sites on a substrate comprising,
   forming a tape automated bonding frame having a first pattern of signal leads and having a second pattern of alignment traces,
   forming on a substrate a third pattern of substrate connection sites and a fourth pattern of registration pads such that the positional relationship of said third and fourth patterns corresponds to the positional relationship of said first and second patterns,
   aligning said registration pads of said substrate to said alignment traces of said frame,
   bonding said alignment traces to said registration pads, and
   connecting said signal leads of said frame to said connection sites of said substrate for electrical communication therebetween.

2. The method of claim 1 wherein said step of forming said tape automated bonding frame includes photolithographically patterning and etching metal to provide said first and second patterns.

3. The method of claim 2 wherein said step of forming said third and fourth patterns includes photolithographically patterning and etching metal on said substrate.

4. The method of claim 1 wherein said steps of forming said second and third patterns include providing an attachment end of said alignment traces having geometric features precisely corresponding to geometric features of said registration pads.

5. The method of claim 1 wherein said step of connecting signal leads to said connection sites is a step of exerting a compression force on said signal leads to contact said connection sites.

6. The method of claim 1 wherein said step of connecting said signal leads to said connection sites is a step performed by one of thermocompression, soldering, epoxying and thermosonic bonding.

7. The method of claim 1 wherein said step of forming registration pads on said substrate includes formation of said registration pads such that the maximum length is in the range of 5 mils to 25 mils, inclusive.

8. The method of claim 1 wherein said step of forming registration pads includes a fifth pattern of redundant registration pads spaced apart from said fourth pattern.

9. A method of aligning a tape automated bonding frame with a substrate comprising, etching metal to form a first pattern of signal leads and a second pattern of alignment leads, said etching defining inner lead ends and outer lead ends on each of said signal leads, providing a substrate having a third pattern of substrate connection sites and a fourth pattern of registration pads, said third pattern corresponding to said first pattern, said fourth pattern having geometric and dimensional features precisely corresponding to said second pattern, aligning said corresponding geometric and dimensional features of said second and fourth patterns, bonding together said alignment leads to said aligned registration pads, and connecting the outer lead ends of said signal leads to said substrate connection sites of said substrate.

10. The method of claim 9 wherein said step of etching metal is a step of photographical patterning and etching of said first and second patterns and wherein said third and fourth patterns are photographically patterned and etched onto said substrate.

11. The method of claim 9 wherein said step of aligning said second and fourth patterns includes optically magnifying said second and fourth patterns.

12. The method of claim 9 wherein said step of connecting said signal leads to said substrate connection sites is a step of providing a compression force on said outer lead ends.

13. The method of claim 10 wherein said registration pads are etched to a maximum length in the range of 5 mils to 25 mils, inclusive.

* * * * *